(12) United States Patent
Wang

(10) Patent No.: US 10,978,542 B2
(45) Date of Patent: Apr. 13, 2021

(54) ARRAY SUBSTRATE, FABRICATING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Kan Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 132 days.

(21) Appl. No.: 16/464,595

(22) PCT Filed: Nov. 6, 2018

(86) PCT No.: PCT/CN2018/114043
§ 371 (c)(1),
(2) Date: May 28, 2019

(87) PCT Pub. No.: WO2020/056881
PCT Pub. Date: Mar. 26, 2020

(65) Prior Publication Data
US 2020/0335568 A1 Oct. 22, 2020

(30) Foreign Application Priority Data

Sep. 18, 2018 (CN) .......................... 201811086414.5

(51) Int. Cl.
*H01L 27/32* (2006.01)
*H01L 51/00* (2006.01)

(52) U.S. Cl.
CPC ...... *H01L 27/3276* (2013.01); *H01L 51/0097* (2013.01); *H01L 2227/323* (2013.01)

(58) Field of Classification Search
CPC ............. H01L 27/3276; H01L 51/0097; H01L 2227/323; H01L 51/56
See application file for complete search history.

(56) References Cited

U.S. PATENT DOCUMENTS

2014/0184057 A1 7/2014 Kim et al.
2016/0329386 A1* 11/2016 Sauers .................... H01L 51/56
(Continued)

FOREIGN PATENT DOCUMENTS

| CN | 104904327 A | 9/2015 |
| CN | 104992956 A | 10/2015 |
| CN | 106950763 A | 7/2017 |

*Primary Examiner* — Kyoung Lee

(57) ABSTRACT

An array substrate, a fabricating method thereof, and a display device are provided. A portion of the array substrate aligned to a secondary function region has a first conductive layer and a second conductive layer disposed on two opposite surfaces of the substrate. A circuit in the second conductive layer is electrically connected to a circuit of a main display region, and a circuit of a driving circuit board is electrically connected to a circuit of the first conductive layer. In this way, a cell on film (COF) is directly placed on a back surface of the substrate, and the main display region and the COF are connected by a passing layer passing through the substrate. No further bending is required.

8 Claims, 8 Drawing Sheets

(56) References Cited

U.S. PATENT DOCUMENTS

2017/0301884 A1  10/2017  Li
2019/0101782 A1   4/2019  Cao et al.

* cited by examiner

ARRAY SUBSTRATE, FABRICATING METHOD THEREOF, AND DISPLAY DEVICE

FIELD OF DISCLOSURE

The present application relates to liquid crystal displays, and more particularly to an array substrate, a fabricating method thereof, and a display device.

BACKGROUND OF DISCLOSURE

Organic light-emitting diode (OLED) devices include a main display region, such as pixels, touch electrodes, and the like, and includes a peripheral secondary functional region, such as a driving circuit board (cell on film, COF). Both of them need to be connected by conductive wires.

In order to achieve a narrow frame design of the OLED devices, a conductive wire area is bent in the prior art to place a secondary function region below the main display region so as to shorten a distance between the main display region and a frame of the OLED devices.

Because the secondary functional region needs to be completely bent below the main display region, a bending angle is wide. Therefore, flexibility of a bending region is required to be relatively high, and product cost is increased. At the same time, there is a risk of film breakage at a bending point, resulting in bad products.

That is, a technical problem in the prior art is to provide a bending region to completely bend the secondary functional region to be located below the main display region.

SUMMARY OF DISCLOSURE

The present application provides an array substrate, a fabricating method thereof, and a display device, so as to solve a technical problem in the prior art of providing a bending region to completely bend a secondary functional region to be located below a main display region.

To solve the above problem, the present application provides technical solutions as follows:

An embodiment of the present application provides an array substrate comprising a main display region and a secondary function region disposed on at least one side of the main display region, wherein a portion of the array substrate aligned to the secondary function region comprises:
  a substrate;
  a first conductive layer disposed on a surface of the substrate away from the main display region;
  a second conductive layer disposed on a surface of the substrate pointing to the main display region;
  a passing layer passing through the substrate and electrically connected to a circuit of the first conductive layer and a circuit of the second conductive layer; and
  a driving circuit board disposed on a surface of the first conductive layer away from the main display region,
  wherein the circuit in the second conductive layer is electrically connected to a circuit of the main display region, and a circuit of the driving circuit board is electrically connected to the circuit of the first conductive layer.

In an array substrate of the present application, the portion of the array substrate aligned to the secondary function region further comprises an insulating layer disposed between the substrate and the second conductive layer, wherein the passing layer passes through the substrate and the insulating layer.

In an array substrate of the present application, the insulating layer comprises an inorganic insulating layer.

In an array substrate of the present application, the portion of the array substrate aligned to the secondary function region further comprises an encapsulation layer covering the second conductive layer.

In an array substrate of the present application, the substrate comprises a flexible substrate.

In an array substrate of the present application, the second conductive layer and the passing layer are formed in a same process.

In an array substrate of the present application, the passing layer is formed by doping the substrate.

An embodiment of the present application provides a display device, comprising an array substrate, the array substrate comprising a main display region and a secondary function region disposed on at least one side of the main display region, wherein a portion of the array substrate aligned to the secondary function region comprises:
  a substrate;
  a first conductive layer disposed on a surface of the substrate away from the main display region;
  a second conductive layer disposed on a surface of the substrate pointing to the main display region;
  a passing layer passing through the substrate and electrically connected to a circuit of the first conductive layer and a circuit of the second conductive layer; and
  a driving circuit board disposed on a surface of the first conductive layer away from the main display region,
  wherein the circuit in the second conductive layer is electrically connected to a circuit of the main display region, and a circuit of the driving circuit board is electrically connected to the circuit of the first conductive layer.

In a display device of the present application, the portion of the array substrate aligned to the secondary function region further comprises an insulating layer disposed between the substrate and the second conductive layer, wherein the passing layer passes through the substrate and the insulating layer.

In a display device of the present application, the insulating layer comprises an inorganic insulating layer.

In a display device of the present application, the portion of the array substrate aligned to the secondary function region further comprises an encapsulation layer covering the second conductive layer.

In a display device of the present application, the substrate comprises a flexible substrate.

An embodiment of the present application provides a method of fabricating an array substrate, the method comprising steps of:
  providing a first substrate provided with a main display region and a secondary function region disposed on at least one side of the main display region;
  fabricating a flexible layer in the secondary function region of the first substrate;
  fabricating a peeling layer on the flexible layer, wherein the peeling layer covers the flexible layer;
  fabricating a first conductive layer on the peeling layer;
  fabricating a second substrate in the secondary function region of the first substrate, wherein the second substrate covers the first conductive layer;
  fabricating a passing layer and a second conductive layer on the second substrate, wherein the first conductive layer is electrically connected to the second conductive layer through the passing layer;

peeling the first substrate, the flexible layer, and the peeling layer; and attaching a driving circuit board to a surface of the second substrate and a surface of the first conductive layer, wherein the driving circuit board is electrically connected to a main display region on the first substrate.

In a fabricating method of the present application, the step of fabricating the peeling layer on the flexible layer comprises a step of fabricating the peeling layer on the flexible layer using a thermal evaporation process.

In a fabricating method of the present application, material of the peeling layer is a parylene-based polymer material.

In a fabricating method of the present application, material of the flexible layer is polyimide.

In a fabricating method of the present application, material of the first conductive layer is one of aluminum, copper, titanium, indium tin oxide, indium oxide-zinc oxide-based oxide.

In a fabricating method of the present application, material of the first conductive layer is one of aluminum, copper, titanium, indium tin oxide, indium oxide-zinc oxide-based oxide.

In a fabricating method of the present application, after the step of fabricating the second substrate in the secondary function region of the first substrate, the method further comprises a step of fabricating an insulating layer on the second substrate.

In a fabricating method of the present application, the step of after fabricating a passing layer and a second conductive layer on the second substrate, the method further comprises steps of:

etching the second substrate and the insulating layer in a partial region aligned to the first conductive layer, wherein an etched region exposes the first conductive layer; and fabricating the second conductive layer on the insulating layer, wherein the second conductive layer covers the insulating layer and the first conductive layer in the etched region, and a connecting portion of the first conductive layer and the second conductive layer in the etched region forms the passing layer.

A beneficial effect of the present application is that: the present application provides a novel array substrate, a fabricating method thereof, and a display device. A portion of the array substrate aligned to the secondary function region comprises a substrate; a first conductive layer and a second conductive layer disposed on two opposite surfaces of the substrate; and a passing layer passing through the substrate and electrically connected to the first conductive layer and the second conductive layer; and a driving circuit board disposed on a surface of the first conductive layer away from the main display region, wherein a circuit in the second conductive layer is electrically connected to a circuit of the main display region. In this way, a bending region originally used for connecting the main display region and the secondary function region is cancelled, and a cell on film (COF) is directly placed on a back surface of the substrate, and the main display region and the COF are connected by the passing layer passing through the substrate. No further bending is required. Reliability of the device is improved to solve the technical problem in the prior art of providing a bending region to completely bend the secondary functional region to be located below the main display region. At the same time, a distance between the main display region and the frame of the display panel is further reduced, and user experience of an organic light-emitting diode (OLED) device is improved.

DESCRIPTION OF DRAWINGS

In order to more clearly describe embodiments of the present disclosure or technical solutions in a conventional technology, drawings required to be used for the embodiments or descriptions of the conventional technology are simply described hereinafter. Apparently, the drawings described below only illustrate some embodiments of the present disclosure. Those skilled in the art can obtain other drawings based on these drawings disclosed herein without creative effort.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc. are only directions by referring to the accompanying drawings. Thus, the used directional terms are used to describe and understand the present disclosure, but the present disclosure is not limited thereto. In figures, elements with similar structures are indicated with the same numbers.

In view of a technical problem in the prior art of providing a bending region to completely bend a secondary functional region to be located below a main display region, the present application can solve the defect.

Figure 1:
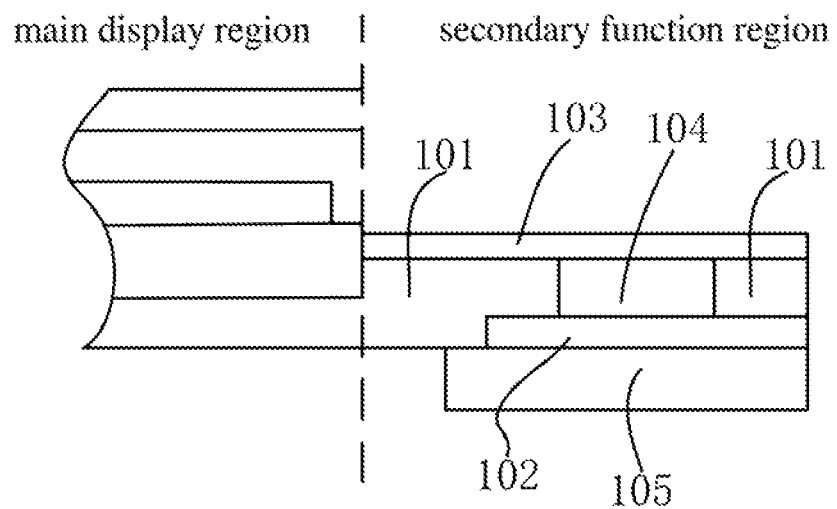
FIG. 1 is a first schematic diagram of an array substrate according to an embodiment of the present application.

As shown in FIG. 1, an array substrate provided by the present application comprises a main display region and a secondary function region disposed on at least one side of the main display region, wherein a portion of the array substrate aligned to the secondary function region comprises:

a substrate 101;

a first conductive layer 102 disposed on a surface of the substrate 101 away from the main display region;

a second conductive layer 103 disposed on a surface of the substrate 101 pointing to the main display region;

a passing layer 104 passing through the substrate 101 and electrically connected to a circuit of the first conductive layer 102 and a circuit of the second conductive layer 103; and a driving circuit board 105 disposed on a surface of the first conductive layer 102 away from the main display region, wherein the circuit in the second conductive layer 103 is electrically connected to a circuit of the main display region, and a circuit of the driving circuit board 105 is electrically connected to the circuit of the first conductive layer 102.

In an embodiment, the substrate comprises a flexible substrate to improve toughness of a device.

In an embodiment, the passing layer is formed by doping the substrate.

Figure 2:
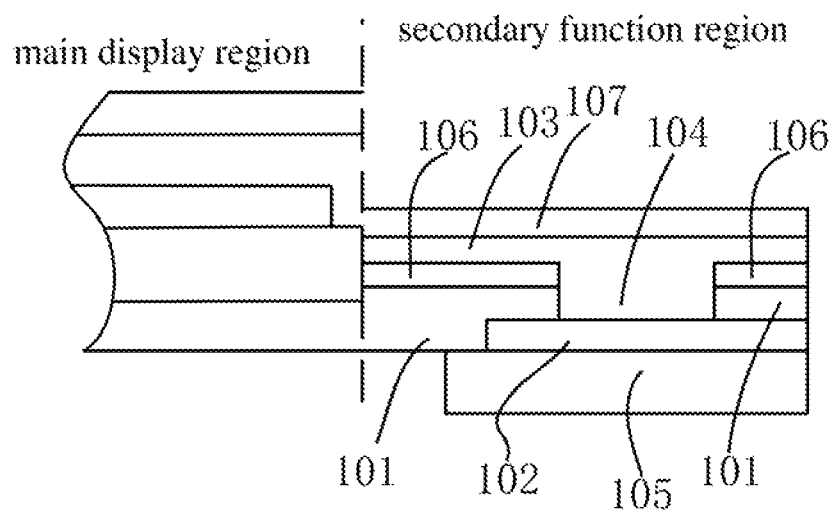
FIG. 2 is a second schematic diagram of an array substrate according to an embodiment of the present application.

In an embodiment, as shown in FIG. 2, the portion of the array substrate provided by the present application aligned to the secondary function region further comprises an insulating layer 106 disposed between the substrate 101 and the second conductive layer 103, wherein the passing layer 104 passes through the substrate 101 and the insulating layer 106.

In an embodiment, the insulating layer comprises an inorganic insulating layer.

In an embodiment, as shown in FIG. 2, the portion of the array substrate provided by the present application aligned to the secondary function region further comprises an encapsulation layer 107 covering the second conductive layer 103 to protect the conductive layer 103.

In an embodiment, as shown in FIG. 2, the second conductive layer and the passing layer are formed in a same process.

To obtain the array substrate in the above embodiment, an embodiment of the present application provides a method of fabricating an array substrate, comprising steps as follows:

In step 1, a first substrate is provided. The first substrate is provided with a main display region and a secondary function region disposed on at least one side of the main display region.

Figure 3A:
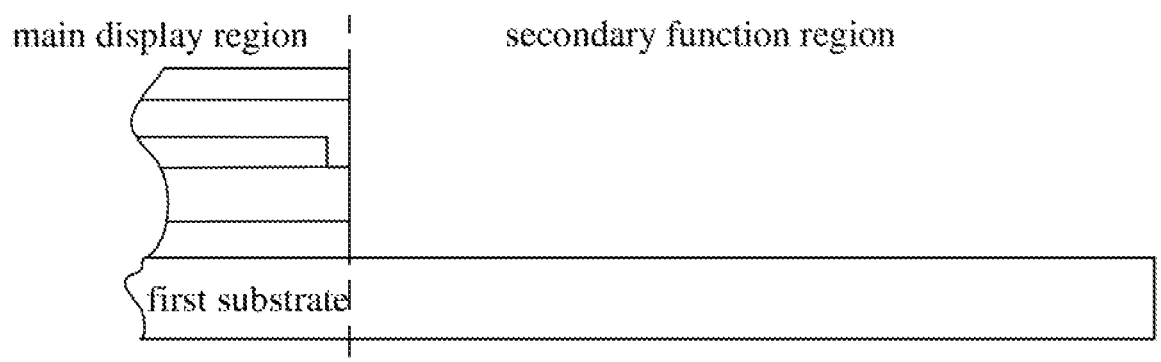
FIG. 3a to FIG. 3p are fabricating schematic diagrams of an array substrate according to an embodiment of the present application.

The first substrate is provided as shown in FIG. 3a. The first substrate is provided with the main display region and the secondary function region.

In step 2, a flexible layer is fabricated in the secondary function region of the first substrate.

Figure 3B:
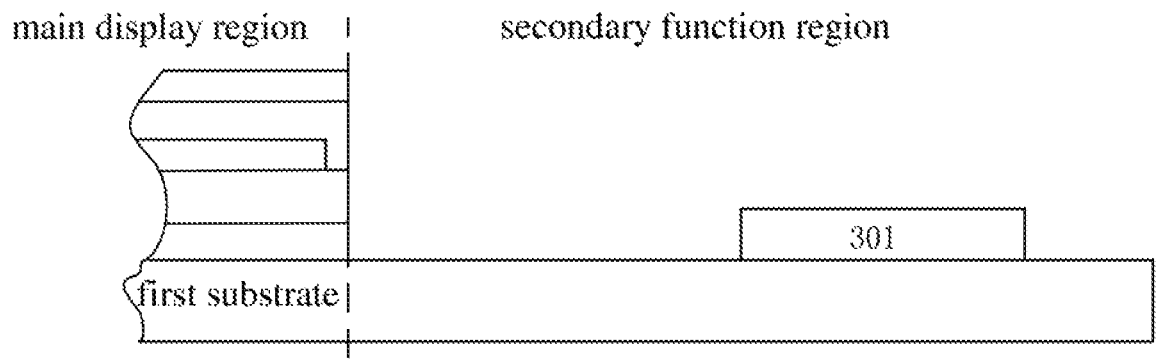

As shown in FIG. 3b, a flexible polymer material layer fabricated on a first substrate, such as a rigid transparent substrate (such as glass). A polymer material of the flexible layer 301 is not limited, such as polyimide (PI). Thickness of the flexible layer 301 is not limited. The flexible layer 301 is located outside the main display region (including an organic light-emitting diode light-emitting region, an encapsulation region, a module region, and a touch region) and cannot cover the main display region.

In step 3, a peeling layer is fabricated on the flexible layer, wherein the peeling layer covers the flexible layer.

Figure 3C:
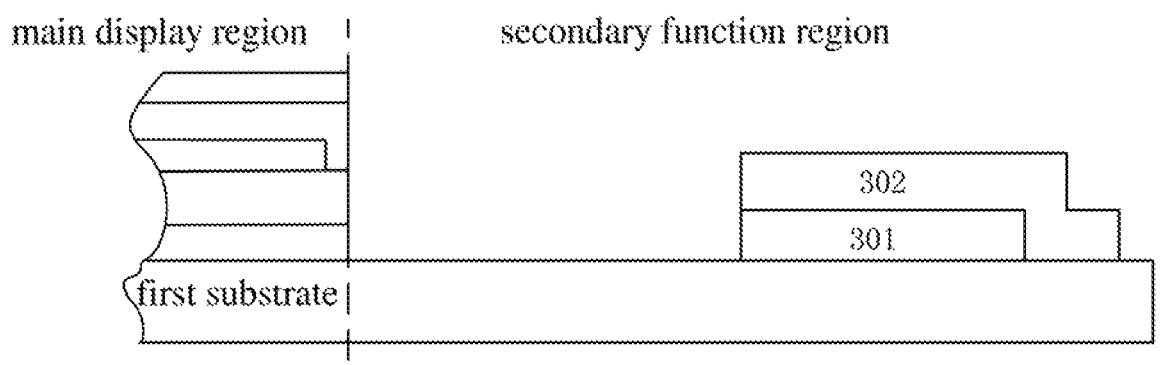

As shown in FIG. 3c, a peeling layer 302 is fabricated on the flexible layer 301. Fabricating processes are not limited, and the processes, such as thermal vapor deposition, chemical vapor deposition (CVD), etc., may be used. Material of the peeling layer 302 can be a parylene-based polymer material, such as parylene C, parylene N, parylene AF4, etc. These materials have properties of high temperature resistance, ultraviolet resistance, no corrosion to the substrate, and the peeling layer 302 is non-tacky and easily peels off from a surface of the substrate. The peeling layer 302 is required to completely cover the surface of the flexible layer 301, and cannot cover the main display region. Thickness of the peeling layer 302 is not limited.

In step 4, a first conductive layer is fabricated on the peeling layer.

Figure 3D:
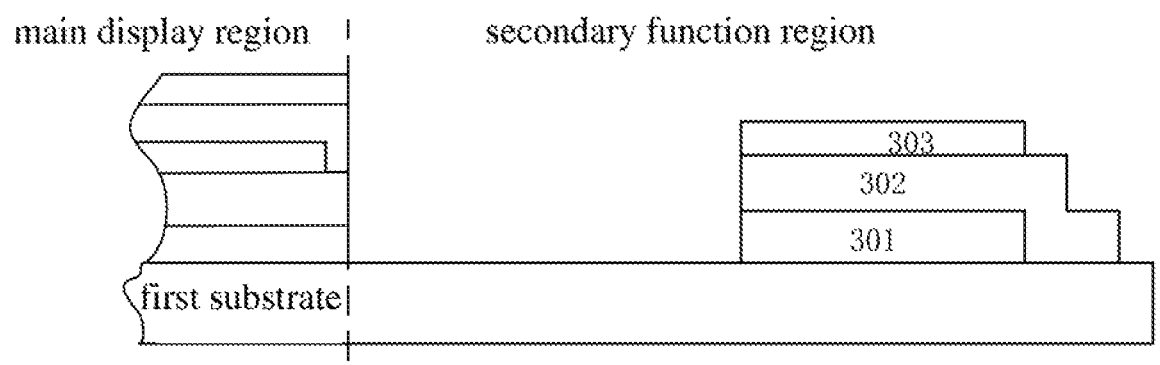

As shown in FIG. 3d, a first conductive layer 303 is fabricated on the peeling layer 302, and material of the first conductive layer is not limited, such as aluminum (Al), copper (Cu), titanium (Ti), indium tin oxide (ITO), indium oxide-zinc oxide-based oxide (IZO), etc. Fabricating processes are not limited, such as physical vapor deposition (PVD), sputtering, etc. A coverage region of the first conductive layer 303 is required not to exceed the coverage region of the below flexible layer 301. Thickness of the first conductive layer 303 is not limited.

Figure 3E:
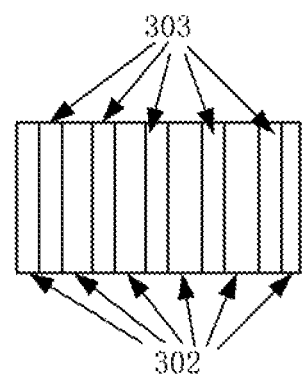

As shown in FIG. 3e, the first conductive layer 303 is patterned to form a circuit of the first conductive layer.

In step 5, a second substrate is fabricated in the secondary function region of the first substrate, wherein the second substrate covers the first conductive layer.

Figure 3F:
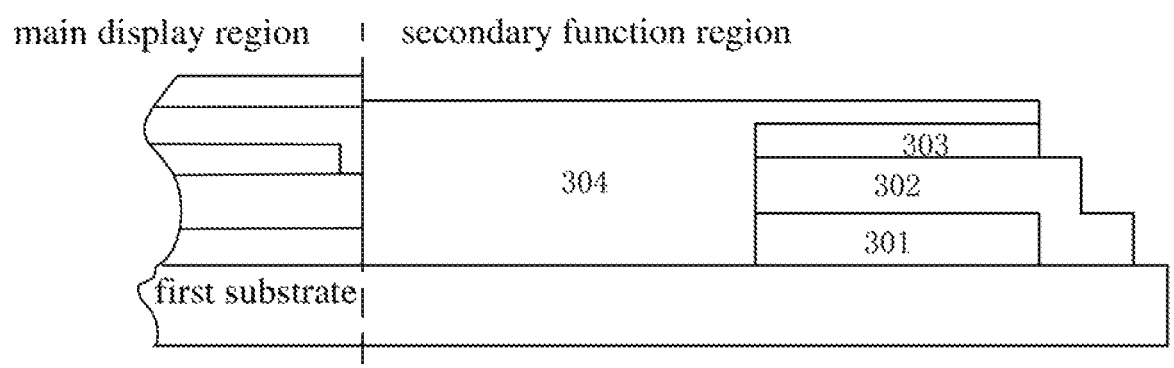

As shown in FIG. 3f, a surface of the secondary functional region is coated with a layer of a flexible polymer material to form a second substrate such as a flexible substrate layer 304. Polymer materials are not limited, such as polyimide (PI). Thickness of the flexible substrate layer 304 is not mandatory, but must be completely capable of covering the flexible layer 301, the peeling layer 302, and the first conductive layer 303.

In step 6, a passing layer and a second conductive layer are fabricated on the second substrate, wherein the first conductive layer is electrically connected to the second conductive layer through the passing layer.

The step comprises steps of fabricating an insulating layer on the second substrate; etching the second substrate and the insulating layer in a partial region aligned to the first conductive layer, wherein an etched region exposes the first conductive layer; and fabricating the second conductive layer on the insulating layer, wherein the second conductive layer covers the insulating layer and the first conductive layer in the etched region, and a connecting portion of the first conductive layer and the second conductive layer in the etched region forms the passing layer.

Figure 3G:
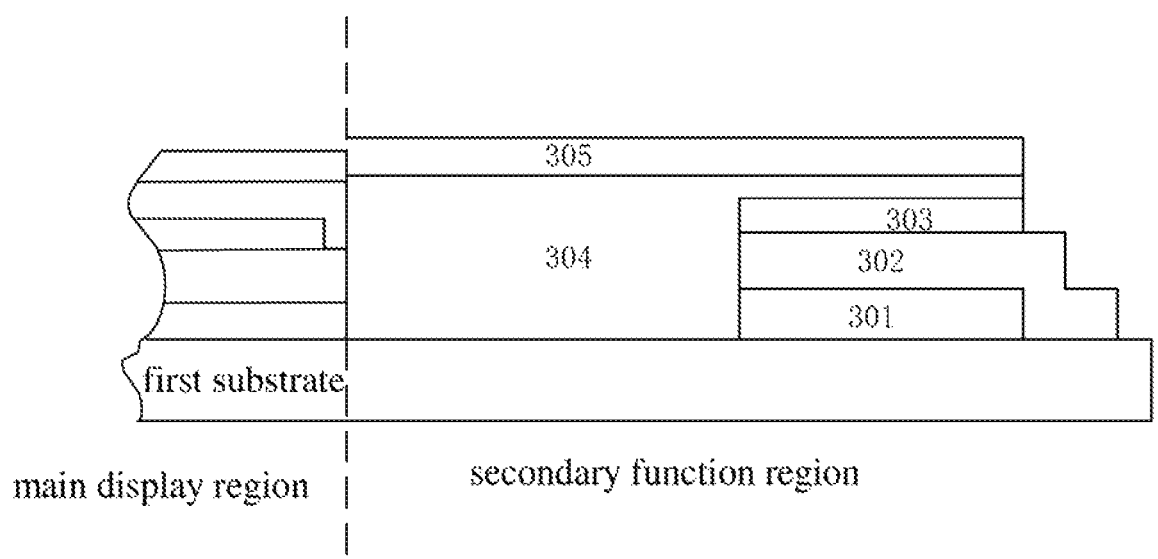

As shown in FIG. 3g, an inorganic insulating layer 305 is fabricated on the flexible substrate layer 304 for blocking water oxygen from invading from below. Material of the inorganic insulating layer 305 is not limited, such as SiNx, SiOxNy, SiOx, AlOx, ZrOx, etc. The inorganic insulating layer 305 is required to completely cover a surface of a non-display region, the thickness of the inorganic insulating film layer is not required. Thickness of the inorganic insulating layer is not limited.

Figure 3H:
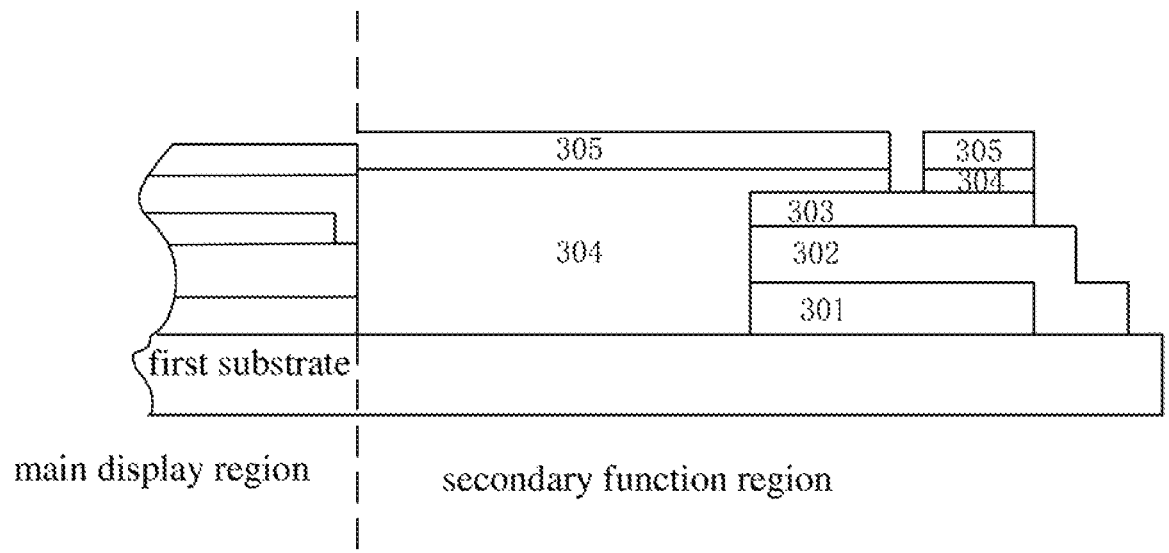
Figure 3I:
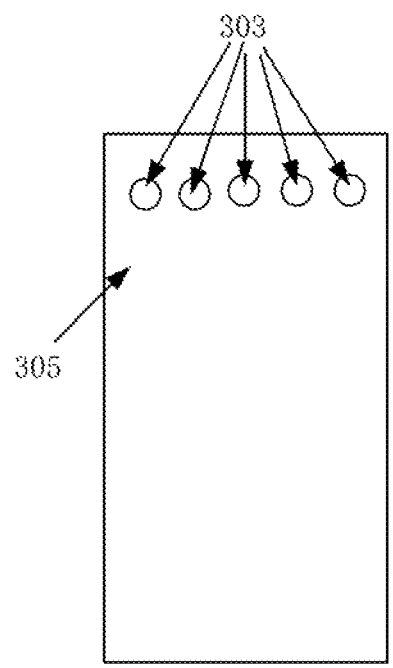

As shown in FIG. 3h, the inorganic insulating film layer 305 and the flexible substrate layer 304 on the first conductive layer 303 are respectively etched by an exposure-developing-etching process to fabricate a corresponding pattern. It is required that a boundary of a fabricated pattern region cannot exceed a boundary of the first conductive layer 303. The inorganic insulating film layer 305 and the flexible substrate layer 304 are completely etched at the pattern, and the surface exposes the first conductive layer 303. Numbers and designs of the pattern are not limited. After etching, the surface of the inorganic insulating film layer 305 is as shown in FIG. 3i.

Figure 3J:
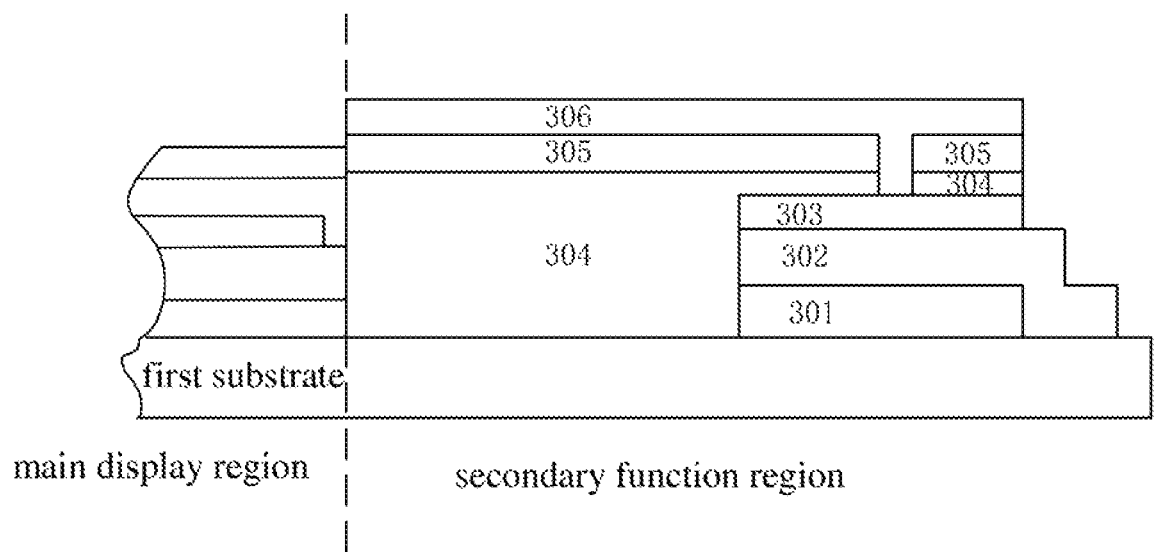

As shown in FIG. 3j, a second conductive layer 306 is deposited in a second conductive layer setting region of a surface of the entire secondary functional region, wherein the second conductive layer 306 is in connection with the first conductive layer 303 at the pattern. Material of the second conductive layer 306 is not limited, such as Al, Cu, Ti, ITO, IZO, etc. Fabricating processes are not limited, such as PVD, sputtering, etc. Thickness of the second conductive layer 306 is not limited.

Figure 3K:
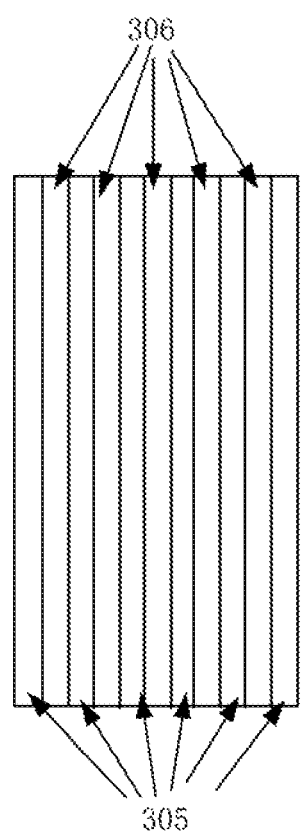

As shown in FIG. 3k, the second conductive layer 306 is patterned to obtain a circuit of the second conductive layer.

Figure 3L:
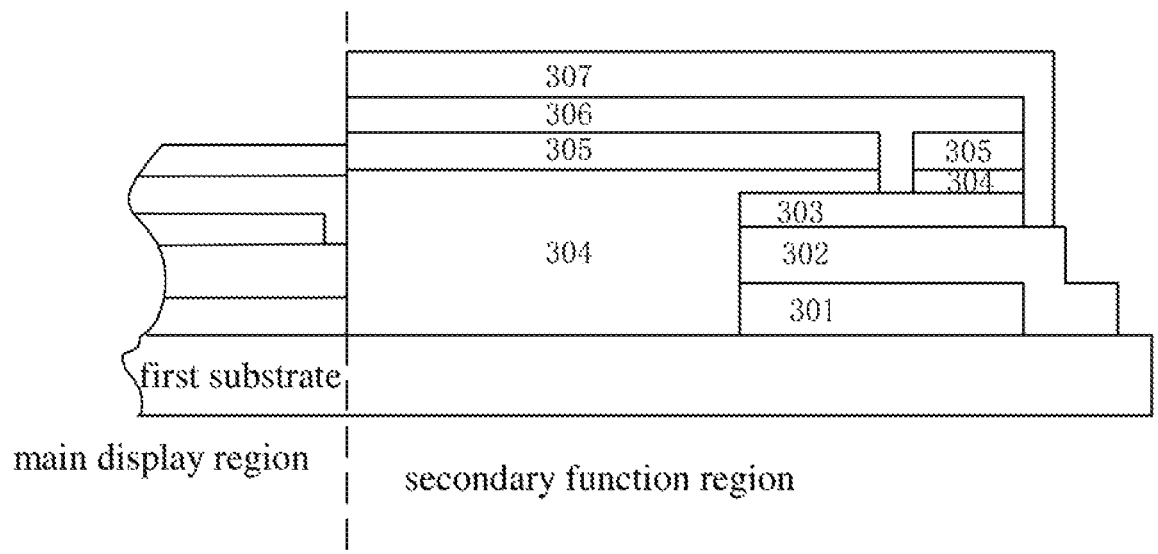

As shown in FIG. 3l, an encapsulation layer 307 is deposited on a surface of the entire secondary functional region.

In step 7, the first substrate, the flexible layer, and the peeling layer are peeled off.

Figure 3M:
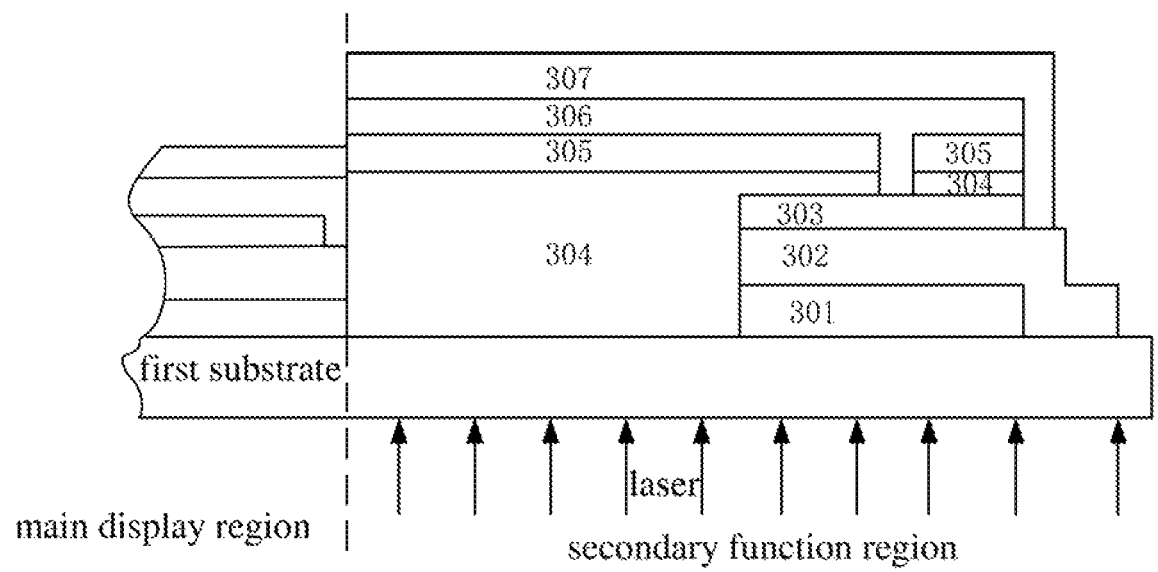
Figure 3N:
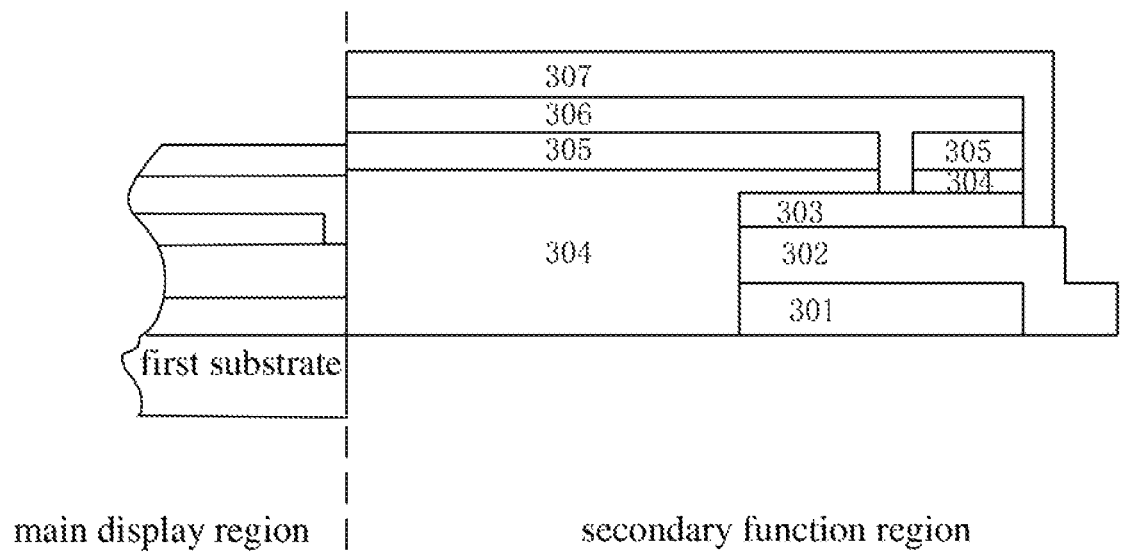

As shown in FIG. 3m and FIG. 3n, the flexible substrate layer 304 and the flexible layer 301 are separated from the first substrate by a laser lift-off technique.

Figure 3O:
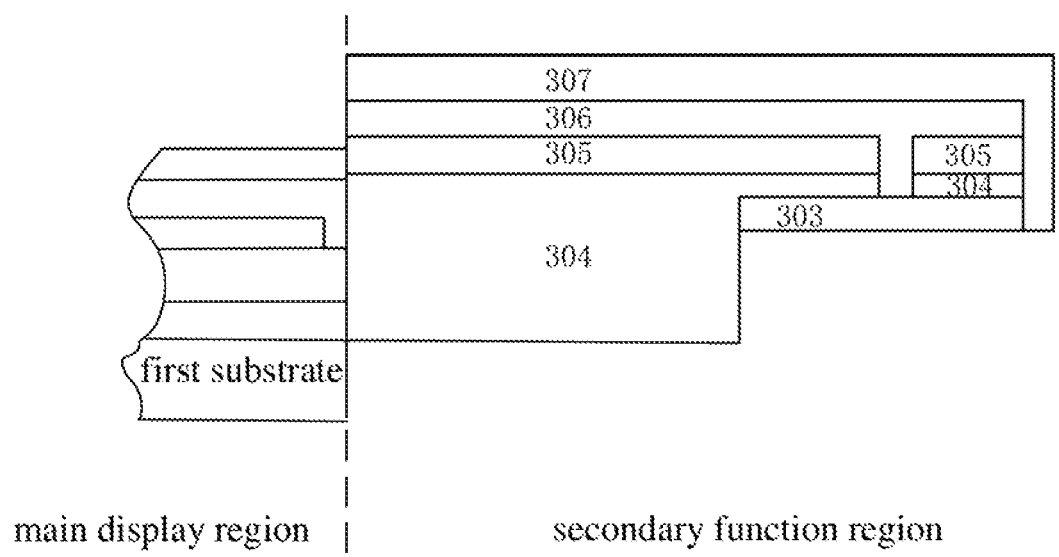

As shown in FIG. 3o, the peeling layer 302 and the flexible layer 301 under the peeling layer 302 are peeled off from below, and a tearing process of the peeling layer 302 is not limited, such as manual peeling or tape peeling, and thus an exposed first conductive layer 303 is obtained on a lower surface of the flexible substrate layer 304.

In step 8, a driving circuit board 308 is attached to a surface of the second substrate and a surface of the first conductive layer, wherein the driving circuit board is electrically connected to a main display region on the first substrate.

Figure 3P:
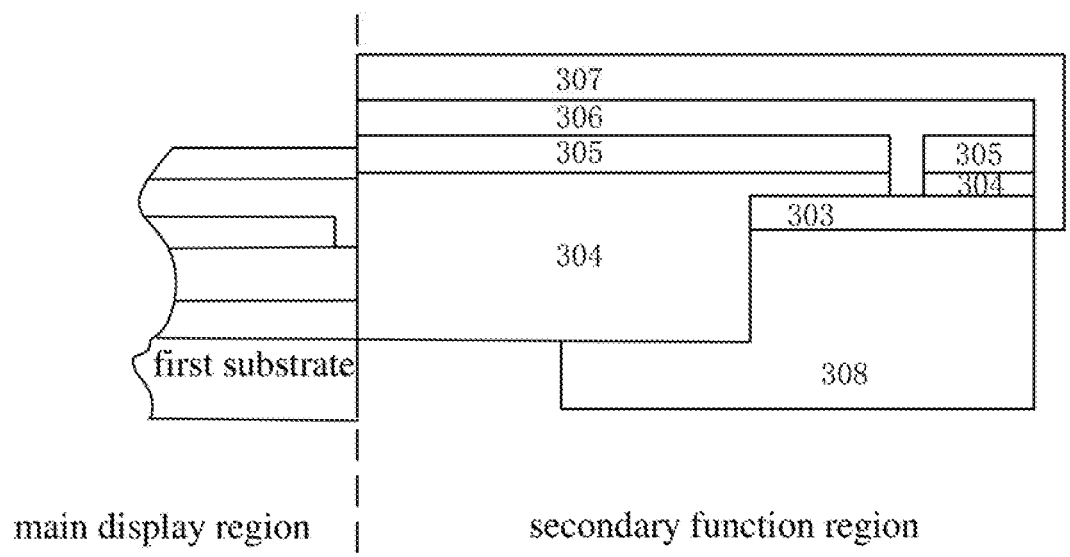

As shown in FIG. 3p, the driving circuit board COF is directly attached to a lower surface of the first conductive layer under the flexible substrate, which can realize the conduction between the COF and the main display region.

Correspondingly, an embodiment of the present application provides a display device comprising an array substrate, the array substrate comprising a main display region and a secondary function region disposed on at least one side of the main display region, wherein a portion of the array substrate aligned to the secondary function region comprises:

a substrate 101;
a first conductive layer 102 disposed on a surface of the substrate 101 away from the main display region;
a second conductive layer 103 disposed on a surface of the substrate 101 pointing to the main display region;
a passing layer 104 passing through the substrate 101 and electrically connected to a circuit of the first conductive layer 102 and a circuit of the second conductive layer 103; and
a driving circuit board 105 disposed on a surface of the first conductive layer 102 away from the main display region,
wherein the circuit in the second conductive layer 103 is electrically connected to a circuit of the main display region, and the circuit of the driving circuit board 105 is electrically connected to the circuit of the first conductive layer 102.

In an embodiment, the substrate comprises a flexible substrate to improve toughness of a device.

In an embodiment, the passing layer is formed by doping the substrate.

In an embodiment, the portion of the array substrate aligned to the secondary function region further comprises an insulating layer 106 disposed between the substrate 101 and the second conductive layer 103, wherein the passing layer 104 passes through the substrate 101 and the insulating layer 106.

In an embodiment, the insulating layer comprises an inorganic insulating layer.

In an embodiment, the portion of the array substrate aligned to the secondary function region further comprises an encapsulation layer 107 covering the second conductive layer 103 to protect the conductive layer 103.

In an embodiment, the second conductive layer and the passing layer are formed in a same process.

It can be seen from the above embodiments that:

The present application provides a novel array substrate, a display device, and a fabricating method thereof. The array substrate comprises a main display region and a secondary function region. A portion of the array substrate aligned to the secondary function region comprises a substrate; a first conductive layer disposed on a surface of the substrate away from the main display region; a second conductive layer disposed on a surface of the substrate pointing to the main display region; a passing layer passing through the substrate and electrically connected to a circuit of the first conductive layer and a circuit of the second conductive layer; and a driving circuit board disposed on a surface of the first conductive layer away from the main display region, wherein the circuit in the second conductive layer is electrically connected to a circuit of the main display region, and a circuit of the driving circuit board is electrically connected to the circuit of the first conductive layer. In this way, a bending region originally used for connecting the main display region and the secondary function region is cancelled, and a cell on film (COF) is directly placed on a back surface of the substrate, and the main display region and the COF are connected by the passing layer passing through the substrate. No further bending is required. Reliability of the device is improved to solve the technical problem in the prior art of providing a bending region to completely bend the secondary functional region to be located below the main display region. At the same time, a distance between the main display region and the frame of the display panel is further reduced, and user experience of an organic light-emitting diode (OLED) device is improved.

As described above, although the present application has been described in preferred embodiments, they are not intended to limit the disclosure. One of ordinary skill in the art, without departing from the spirit and scope of the disclosure within, can make various modifications and variations, so the range of the scope of the disclosure is defined by the claims.

The invention claimed is:

1. A method of fabricating an array substrate, comprising steps of:
   providing a first substrate provided with a main display region and a secondary function region disposed on at least one side of the main display region;
   fabricating a flexible layer in the secondary function region of the first substrate;
   fabricating a peeling layer on the flexible layer, wherein the peeling layer covers the flexible layer;
   fabricating a first conductive layer on the peeling layer;
   fabricating a second substrate in the secondary function region of the first substrate, wherein the second substrate covers the first conductive layer;
   fabricating a passing layer and a second conductive layer on the second substrate, wherein the first conductive layer is electrically connected to the second conductive layer through the passing layer;
   peeling the first substrate, the flexible layer, and the peeling layer; and
   attaching a driving circuit board to a surface of the second substrate and a surface of the first conductive layer, wherein the driving circuit board is electrically connected to the main display region on the first substrate.

2. The method of fabricating the array substrate according to claim 1, wherein the step of fabricating the peeling layer on the flexible layer comprises a step of fabricating the peeling layer on the flexible layer using a thermal evaporation process.

3. The method of fabricating the array substrate according to claim 2, wherein material of the peeling layer is a parylene-based polymer material.

4. The method of fabricating the array substrate according to claim 1, wherein material of the flexible layer is polyimide.

5. The method of fabricating the array substrate according to claim 1, wherein material of the first conductive layer is one of aluminum, copper, titanium, indium tin oxide, indium oxide-zinc oxide-based oxide.

6. The method of fabricating the array substrate according to claim 1, wherein material of the first conductive layer is one of aluminum, copper, titanium, indium tin oxide, indium oxide-zinc oxide-based oxide.

7. The method of fabricating the array substrate according to claim 1, wherein after the step of fabricating the second substrate in the secondary function region of the first substrate, the method further comprises a step of fabricating an insulating layer on the second substrate.

8. The method of fabricating the array substrate according to claim 1, wherein the step of after fabricating the passing layer and the second conductive layer on the second substrate, the method further comprises steps of:
- etching the second substrate and the insulating layer in a partial region aligned to the first conductive layer, wherein an etched region exposes the first conductive layer; and
- fabricating the second conductive layer on the insulating layer, wherein the second conductive layer covers the insulating layer and the first conductive layer in the etched region, and a connecting portion of the first conductive layer and the second conductive layer in the etched region forms the passing layer.

* * * * *